(12) United States Patent
Tang (10) Patent No.: US 10,797,122 B2
(45) Date of Patent: Oct. 6, 2020

(54) OLED DISPLAY AND METHOD FOR MANUFACTURING SAME

(71) Applicant: Wuhan China Star Optoelectronics Technology Co., Ltd., Wuhan (CN)

(72) Inventor: Yuejun Tang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 29 days.

(21) Appl. No.: 16/311,680

(22) PCT Filed: Nov. 1, 2018

(86) PCT No.: PCT/CN2018/113256
§ 371 (c)(1),
(2) Date: Dec. 20, 2018

(87) PCT Pub. No.: WO2020/062410
PCT Pub. Date: Apr. 2, 2020

(65) Prior Publication Data
US 2020/0127070 A1 Apr. 23, 2020

(30) Foreign Application Priority Data

Sep. 27, 2018 (CN) .......................... 2018 1 1129499

(51) Int. Cl.
*H01L 51/56* (2006.01)
*H01L 27/32* (2006.01)
*H01L 51/52* (2006.01)

(52) U.S. Cl.
CPC ...... *H01L 27/3258* (2013.01); *H01L 27/3246* (2013.01); *H01L 27/3248* (2013.01);
(Continued)

(58) Field of Classification Search
CPC ............. H01L 27/3258; H01L 51/5206; H01L 51/5221; H01L 51/5237; H01L 27/3248; H01L 27/3246; H01L 51/56
(Continued)

(56) References Cited

U.S. PATENT DOCUMENTS 9,450,204 B2 * 9/2016 Hayashi .............. H01L 51/5256
9,614,180 B2 * 4/2017 Kang .................. H01L 27/3246
(Continued)

FOREIGN PATENT DOCUMENTS

CN 104716156 6/2015
CN 107680993 2/2018
(Continued)

*Primary Examiner* — Vu A Vu (57) ABSTRACT

The present disclosure provides an OLED display. The OLED display includes a substrate; a TFT device disposed on the substrate, wherein a gate electrode, a source electrode, and a drain electrode of the TFT device are isolated from each other by an inorganic insulation layer; a planarization layer disposed on the TFT device and the inorganic insulation layer; a pixel defining layer disposed on the planarization layer, wherein the pixel defining layer defines a plurality of pixels in the OLED display, and each pixel includes a plurality of sub-pixels; an OLED device disposed on the planarization layer and the pixel defining layer; and an encapsulation layer disposed on the OLED device; wherein one or more inorganic material included in the inorganic insulation layer, the planarization layer, the pixel defining layer, and the encapsulation layer and a cathode electrode of the OLED device surround each sub-pixel, each pixel, or more than one pixel of the OLED display.

14 Claims, 4 Drawing Sheets

(52) U.S. Cl.
CPC ...... *H01L 51/5206* (2013.01); *H01L 51/5221* (2013.01); *H01L 51/5237* (2013.01); *H01L 51/56* (2013.01)

(58) Field of Classification Search
USPC .......................................................... 257/40
See application file for complete search history.

(56) References Cited

U.S. PATENT DOCUMENTS

| | | |
|---|---|---|
| 2017/0012086 A1 | 1/2017 | Kim et al. |
| 2018/0159065 A1 | 6/2018 | Kim |
| 2019/0229172 A1 | 7/2019 | Liu et al. |

FOREIGN PATENT DOCUMENTS

| | | |
|---|---|---|
| CN | 108133952 | 6/2018 |
| CN | 208904022 | 5/2019 |

\* cited by examiner

OLED DISPLAY AND METHOD FOR MANUFACTURING SAME

RELATED APPLICATIONS

This application is a National Phase of PCT Patent Application No. PCT/CN2018/113256 having International filing date of Nov. 1, 2018, which claims the benefit of priority of Chinese Patent Application No. 201811129499.0 filed on Sep. 27, 2018. The contents of the above applications are all incorporated by reference as if fully set forth herein in their entirety.

FIELD AND BACKGROUND OF THE INVENTION

The present disclosure relates to the field of display technology, and more particularly to an organic light emitting diode (OLED) display and a method for manufacturing same.

Organic light emitting diode (OLED) displays have advantages, such as wide viewing angles, high contrast, and short response times. Thus, manufacturers make their endeavor to research and develop OLED displays.

It is known that OLED displays include an essential component—OLED device. OLED device is consisted of an anode electrode, a cathode electrode, and an organic light-emitting material sandwiched therebetween. In order to avoid entrance of water/oxygen into OLED device that may damage displays and shorten display lifetime, an encapsulation process has to be performed for OLED device during manufacturing procedure of OLED displays.

Encapsulation, according to prior art, is generally classified to include cover encapsulation technique and thin film encapsulation technique. However, existing encapsulation technique still cannot achieve a satisfied effect that completely avoids water/oxygen from entering OLED device.

Therefore, there is a need to provide an OLED display and a method for manufacturing same.

SUMMARY OF THE INVENTION

The present disclosure provides an organic light emitting diode (OLED) display and a method for manufacturing same to solve the problems existing in prior art, where water/oxygen cannot be satisfactorily or completely prevented from entering OLED device.

To solve the above-said problems, the present disclosure provides an organic light emitting diode (OLED) display, comprising:
  a substrate;
  a thin film transistor (TFT) device disposed on the substrate, wherein a gate electrode, a source electrode, and a drain electrode of the TFT device are isolated from each other by an inorganic insulation layer;
  a planarization layer disposed on the TFT device and the inorganic insulation layer;
  a pixel defining layer disposed on the planarization layer, wherein the pixel defining layer defines a plurality of pixels in the OLED display, and each pixel includes a plurality of sub-pixels;
  an OLED device disposed on the planarization layer and the pixel defining layer; and
  an encapsulation layer disposed on the OLED device;
  wherein one or more inorganic material included in the inorganic insulation layer, the planarization layer, the pixel defining layer, and the encapsulation layer and a cathode electrode of the OLED device surround each sub-pixel, each pixel, or more than one pixel of the OLED display.

In accordance with one preferred embodiment of the present disclosure, the inorganic material is selected from silicon oxide, silicon nitride, silicon oxynitride, or aluminum oxide.

In accordance with one preferred embodiment of the present disclosure,
  the pixel defining layer is made of the inorganic material, and the pixel defining layer includes a first plug that is connected to the inorganic insulation layer via a through-hole in the planarization layer;
  the OLED display further includes a first connection structure, the first connection structure is connected to the inorganic insulation layer via the through-hole in the planarization layer, and the first connection structure and an anode electrode of the OLED device are made of a same material;
  the pixel defining layer is made of an organic material; the OLED device further includes the first connection structure, the first connection structure is connected to the inorganic insulation layer via the through-hole in the planarization layer, and the first connection structure and the anode electrode of the OLED device are made of a same material; the cathode electrode of the OLED device includes a second connection structure, and the second connection structure is connected to an upper surface of the first connection structure via a through-hole in the pixel defining layer;
  the pixel defining layer is made of an organic material; the planarization layer is consisted of an organic sublayer and an inorganic sublayer, and the inorganic sublayer of the planarization layer is disposed on the organic sublayer of the planarization layer; the cathode electrode of the OLED device includes a third connection structure, and the third connection structure is connected to the inorganic sublayer of the planarization layer via the through-hole in the pixel defining layer; or
  the pixel defining layer is consisted of an organic sublayer and an inorganic sublayer, and the organic sublayer of the pixel defining layer is disposed on the inorganic sublayer of the pixel defining layer; the inorganic sublayer of the pixel defining layer does not include or includes a second plug, and the second plug is connected to the inorganic insulation layer via the through-hole in the planarization layer; the anode electrode of the OLED device is disposed on the planarization layer; the cathode electrode of the OLED device includes a fourth connection structure, and the fourth connection structure is connected to the inorganic sublayer of the pixel defining layer via the through-hole in the pixel defining layer.

In accordance with one preferred embodiment of the present disclosure, the organic material is selected from acrylic organic compound, polyamide, or polyimide.

In accordance with one preferred embodiment of the present disclosure,
  the inorganic insulation layer comprises:
    a buffer layer disposed on the substrate;
    a gate insulation layer disposed on the buffer layer; and
    an interlayer insulation layer disposed on the gate insulation layer; and
  the encapsulation layer has a stack structure that includes a plurality of inorganic sublayers and a plurality of organic sublayers.

In addition, the present disclosure provides a method for manufacturing an organic light emitting diode (OLED) display, comprising steps of:

providing a substrate;

forming a thin film transistor (TFT) device on the substrate, wherein a gate electrode, a source electrode, and a drain electrode of the TFT device are isolated from each other by an inorganic insulation layer;

forming a planarization layer on the TFT device and the inorganic insulation layer;

forming a pixel defining layer on the planarization layer, wherein the pixel defining layer defines a plurality of pixels in the OLED display, and each pixel includes a plurality of sub-pixels;

forming an OLED device on the planarization layer and the pixel defining layer; and forming an encapsulation layer on the OLED device;

wherein one or more inorganic material included in the inorganic insulation layer, the planarization layer, the pixel defining layer, and the encapsulation layer and a cathode electrode of the OLED device surround each sub-pixel, each pixel, or more than one pixel of the OLED display.

In accordance with one preferred embodiment of the present disclosure, the inorganic material is selected from silicon oxide, silicon nitride, silicon oxynitride, or aluminum oxide.

In accordance with one preferred embodiment of the present disclosure, the method further comprises steps of:

forming the pixel defining layer from the inorganic material, wherein the pixel defining layer includes a first plug that is connected to the inorganic insulation layer via a through-hole in the planarization layer;

forming a first connection structure, wherein the first connection structure is connected to the inorganic insulation layer via the through-hole in the planarization layer, and the first connection structure and an anode electrode of the OLED device are made of a same material and are formed simultaneously;

forming the pixel defining layer from an organic material; forming the first connection structure, wherein the first connection structure is connected to the inorganic insulation layer via the through-hole in the planarization layer, and the first connection structure and the anode electrode of the OLED device are made of a same material and are formed simultaneously; and forming the cathode electrode of the OLED device, such that the cathode electrode of the OLED device includes a second connection structure, wherein the second connection structure is connected to an upper surface of the first connection structure via a through-hole in the pixel defining layer;

forming the pixel defining layer from an organic material; forming the planarization layer includes forming an organic sublayer and an inorganic sublayer, wherein the inorganic sublayer of the planarization layer is formed on the organic sublayer of the planarization layer; forming the cathode electrode of the OLED device, such that the cathode electrode of the OLED device includes a third connection structure, wherein the third connection structure is connected to the inorganic sublayer of the planarization layer via the through-hole in the pixel defining layer; or forming the pixel defining layer includes forming an organic sublayer and an inorganic sublayer, wherein the organic sublayer of the pixel defining layer is formed on the inorganic sublayer of the pixel defining layer; the inorganic sublayer of the pixel defining layer does not include or includes a second plug, and the second plug is connected to the inorganic insulation layer via the through-hole in the planarization layer; forming the anode electrode of the OLED device, such that the anode electrode of the OLED device is formed on the planarization layer; and forming the cathode electrode of the OLED device, such that the cathode electrode of the OLED device includes a fourth connection structure, wherein the fourth connection structure is connected to the inorganic sublayer of the pixel defining layer via the through-hole in the pixel defining layer.

In accordance with one preferred embodiment of the present disclosure, the organic material is selected from acrylic organic compound, polyamide, or polyimide.

In accordance with one preferred embodiment of the present disclosure, the inorganic insulation layer comprises:
a buffer layer formed on the substrate;
a gate insulation layer formed on the buffer layer; and
an interlayer insulation layer formed on the gate insulation layer; and forming the encapsulation layer includes forming a stack structure that includes a plurality of inorganic sublayers and a plurality of organic sublayers.

Compared to the prior art, the present disclosure provides an OLED display and a method for manufacturing same. According to the present disclosure, one or more inorganic material included in the inorganic insulation layer, the planarization layer, the pixel defining layer, and the encapsulation layer, the plug, and the connection structure surround each sub-pixel, each pixel, or more than one pixel of the OLED display, therefore water/oxygen is effectively prevented from entering OLED device.

DESCRIPTION OF SPECIFIC EMBODIMENTS OF THE INVENTION

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Figure 1A:
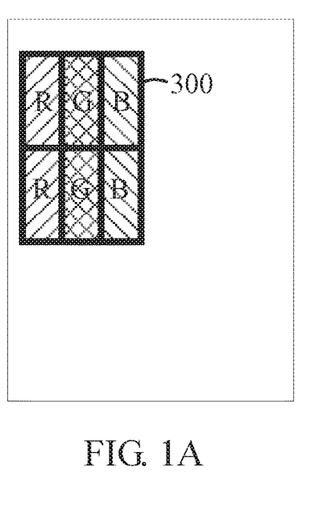
FIGS. 1A, 1B, and 1C are schematic diagrams showing top-views of an OLED display manufactured according to the present disclosure.
Figure 1B:
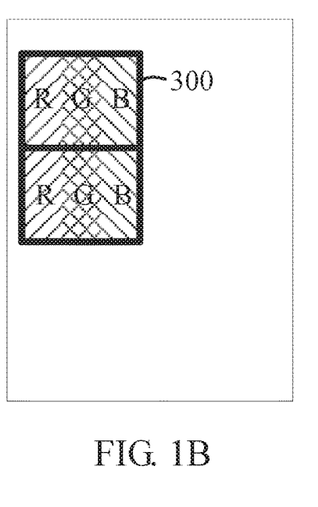
Figure 1C:
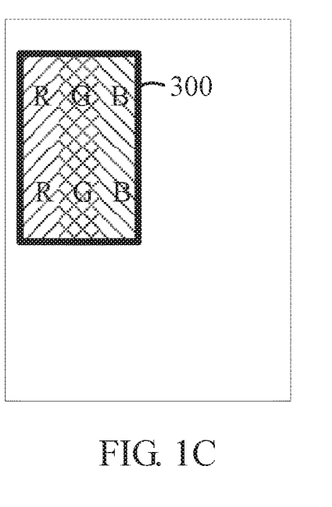

Please refer to drawings. FIGS. 1A, 1B, and 1C are schematic diagrams showing top-views of an OLED display manufactured according to the present disclosure. FIGS. 2, 3, 4, 5, and 6A-6B are schematic diagrams respectively showing a cross-sectional view of an OLED display manufactured according to EMBODIMENT ONE to EMBODIMENT FIVE of the present disclosure.

As shown in FIGS. 2, 3, 4, 5, and 6A-6B, to manufacture an OLED display according to the present disclosure is to form an array layer and a light-emitting layer 62 on a substrate 10 first, and then to perform an encapsulation process for the light-emitting layer 62. The films sequentially formed from bottom to top in FIGS. 2, 3, 4, 5, and 6A-6B include a substrate 10, a buffer layer 81, a semiconductor active layer 23, a gate insulation layer 82, a gate electrode 21, an interlayer insulation layer 83, a source electrode 24 and a drain electrode 22, a planarization layer 40, an anode electrode 61, a pixel defining layer 50, a light-emitting layer 62, a cathode electrode 63, and an encapsulation layer 70 (including an inorganic sublayer 71, an organic sublayer 72, and an inorganic sublayer 73). Low temperature polysilicon (LTPS) top-gate type TFT structure is shown in the drawings as an example. However, the semiconductor active layer and the TFT device are not limited to those shown in the drawings.

The present disclosure provides an organic light emitting diode (OLED) display. The OLED display includes:
  a substrate 10;
  a thin film transistor (TFT) device 20 disposed on the substrate 10, wherein a gate electrode 21, a source electrode 24, and a drain electrode 22 of the TFT device 20 are isolated from each other by an inorganic insulation layer 80 (including a buffer layer 81, a gate insulation layer 82, and an interlayer insulation layer 83);
  a planarization layer 40 disposed on the TFT device 20 and the inorganic insulation layer 80;
  a pixel defining layer 50 disposed on the planarization layer 40, wherein the pixel defining layer 50 defines a plurality of pixels 300 in the OLED display, and each pixel 300 includes a plurality of sub-pixels (such as sub-pixel R, sub-pixel G, and sub-pixel B shown in FIGS. 1A, 1B, and 1C);
  an OLED device (including an anode electrode 61, a light-emitting layer 62, and a cathode electrode 63) disposed on the planarization layer 40 and the pixel defining layer 50; and
  an encapsulation layer 70 (including an inorganic sublayer 71, an organic sublayer 72, and an inorganic sublayer 73) disposed on the OLED device.

In addition, the present disclosure provides a method for manufacturing an organic light emitting diode (OLED) display. The method includes steps of:
  providing a substrate 10;
  forming a thin film transistor (TFT) device 20 on the substrate 10, wherein a gate electrode 21, a source electrode 24, and a drain electrode 22 of the TFT device 20 are isolated from each other by an inorganic insulation layer 80 (including a buffer layer 81, a gate insulation layer 82, and an interlayer insulation layer 83);
  forming a planarization layer 40 on the TFT device 20 and the inorganic insulation layer 80;
  forming a pixel defining layer 50 on the planarization layer 40, wherein the pixel defining layer 50 defines a plurality of pixels 300 in the OLED display, and each pixel 300 includes a plurality of sub-pixels (such as sub-pixel R, sub-pixel G, and sub-pixel B shown in FIGS. 1A, 1B, and 1C);
  forming an OLED device (including an anode electrode 61, a light-emitting layer 62, and a cathode electrode 63) on the planarization layer 40 and the pixel defining layer 50; and
  forming an encapsulation layer 70 (including an inorganic sublayer 71, an organic sublayer 72, and an inorganic sublayer 73) on the OLED device.

According to the present disclosure, one or more inorganic material included in the inorganic insulation layer 80 (including the buffer layer 81, the gate insulation layer 82, and the interlayer insulation layer 83), the planarization layer 40, the pixel defining layer 50, and the encapsulation layer 70 and a cathode electrode 63 of the OLED device surround each sub-pixel (see FIG. 1A), each pixel (see FIG. 1B), or more than one pixel (see FIG. 1C) of the OLED display, therefore water/oxygen is prevented from entering OLED device.

The inorganic material is selected from silicon oxide ($SiO_2$), silicon nitride ($SiN_x$), silicon oxynitride, or aluminum oxide ($Al_2O_3$). However, the inorganic material is not limited to these materials.

The encapsulation layer 70 is not limited to have the stack structure consisted of two inorganic sublayers 71 and 73 and one organic sublayer 72, as shown in the drawings, but could have a stack structure that includes a plurality of inorganic sublayers and a plurality of organic sublayers.

Five embodiments are disclosed in the present disclosure, which will be explained in detail in the following description.

Embodiment One

Figure 2:
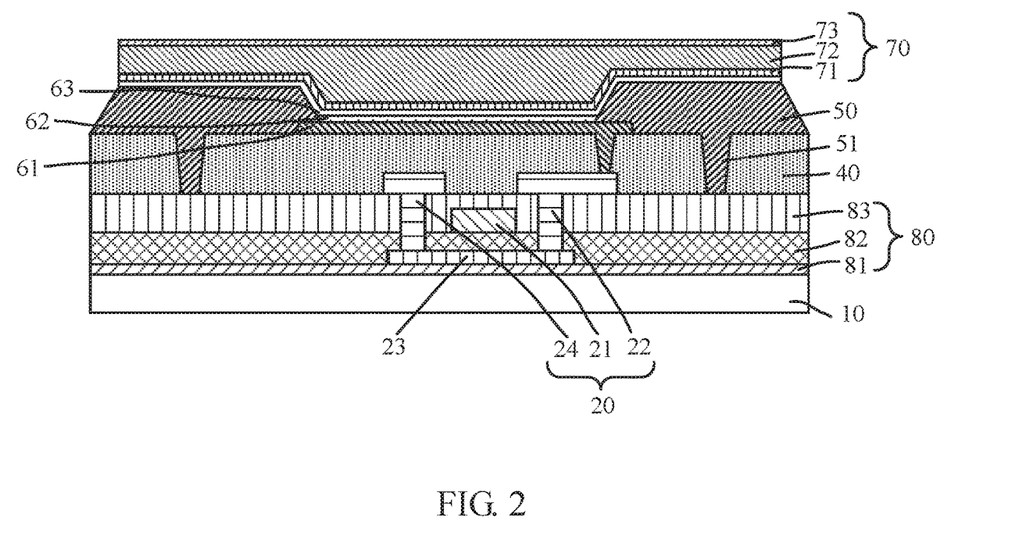
FIG. 2 is a schematic diagram showing a cross-sectional view of an OLED display manufactured according to EMBODIMENT ONE of the present disclosure.

Please refer to FIG. 2. In this embodiment, the pixel defining layer 50 is made of an inorganic material. The inorganic material is selected from silicon oxide ($SiO_2$), silicon nitride ($SiN_x$), silicon oxynitride, or aluminum oxide ($Al_2O_3$). However, the inorganic material is not limited to these materials. Moreover, the pixel defining layer 50 includes a first plug 51 that is connected to the interlayer insulation layer 83 via a through-hole in the planarization layer 40.

Therefore, the inorganic insulation layer 80, the first plug 51, the pixel defining layer 50, and the inorganic sublayers 71 and 73 of the encapsulation layer 70 in the TFT array are all made of inorganic material. The inorganic material and the cathode electrode 63 of the OLED device surround the OLED device, so as to prevent water/oxygen from entering OLED device.

The encapsulation structure in EMBODIMENT ONE is formed by performing at least steps of:
  forming the pixel defining layer 50 from the inorganic material, wherein the pixel defining layer 50 includes a first plug 51 that is connected to the inorganic insulation layer 80 via a through-hole in the planarization layer 40.

Embodiment Two

Figure 3:
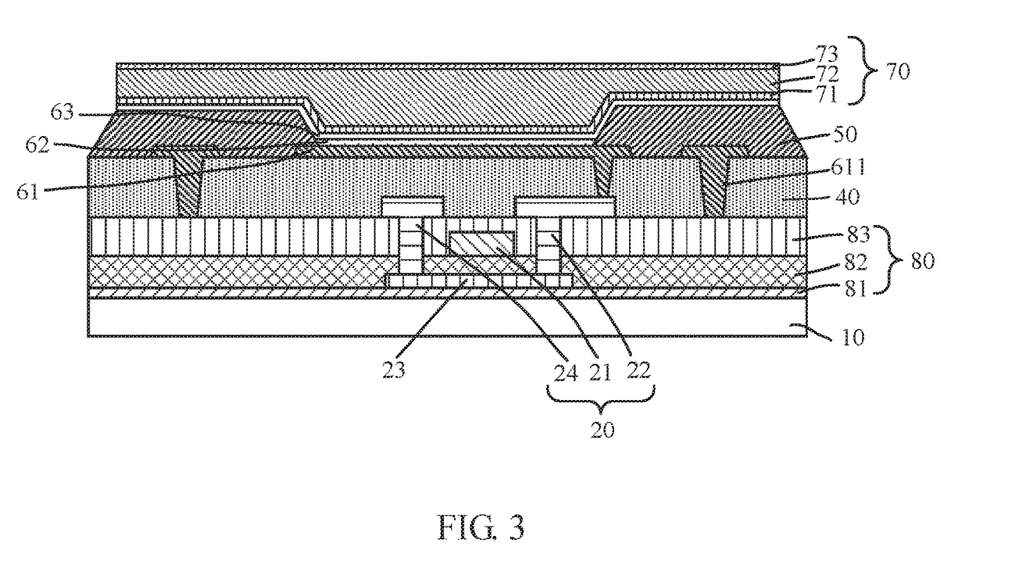
FIG. 3 is a schematic diagram showing a cross-sectional view of an OLED display manufactured according to EMBODIMENT TWO of the present disclosure.

Please refer to FIG. 3. In this embodiment, the OLED display further includes a first connection structure 611. The first connection structure 611 is connected to the interlayer insulation layer 83 via the through-hole in the planarization layer 40. The first connection structure 611 and an anode electrode 61 of the OLED device are made of a same material and are formed simultaneously. The first connection structure 611 is electrically insulated from the anode electrode 61.

Therefore, the inorganic insulation layer 80, the pixel defining layer 50, and the inorganic sublayers 71 and 73 of the encapsulation layer 70 in the TFT array are all made of inorganic material. The inorganic material, the first connection structure 611, and the cathode electrode 63 of the OLED device surround the OLED device, so as to prevent water/oxygen from entering OLED device.

The encapsulation structure in EMBODIMENT TWO is formed by performing at least steps of:
 forming the first connection structure 611, wherein the first connection structure 611 is connected to the interlayer insulation layer 83 via the through-hole in the planarization layer 40, the first connection structure 611 and an anode electrode 61 of the OLED device are made of a same material and are formed simultaneously, and the first connection structure 611 is electrically insulated from the anode electrode 61.

Embodiment Three

Figure 4:
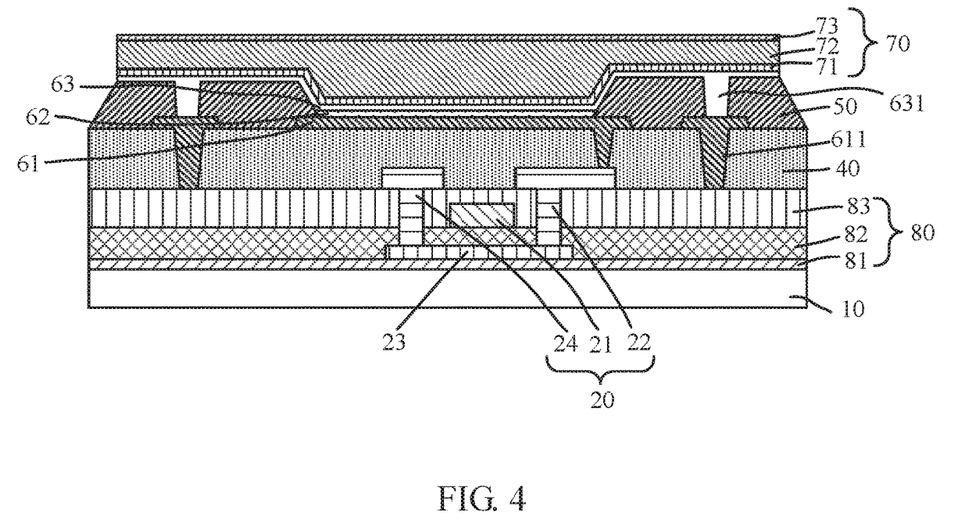
FIG. 4 is a schematic diagram showing a cross-sectional view of an OLED display manufactured according to EMBODIMENT THREE of the present disclosure.

Please refer to FIG. 4. In this embodiment, the pixel defining layer 50 is made of an organic material. The OLED device further includes the first connection structure 611. The first connection structure 611 is connected to the interlayer insulation layer 83 via the through-hole in the planarization layer 40. The first connection structure 611 and the anode electrode 61 of the OLED device are made of a same material and could be form simultaneously. The first connection structure 611 is electrically insulated from the anode electrode 61. The cathode electrode 63 of the OLED device includes a second connection structure 631. The second connection structure 631 is connected to an upper surface of the first connection structure 611 via a through-hole in the pixel defining layer 50. The second connection structure 631 is electrically insulated from the anode electrode 61.

Therefore, the inorganic insulation layer 80, and the inorganic sublayers 71 and 73 of the encapsulation layer 70 in the TFT array are all made of inorganic material. The inorganic material, the first connection structure 611, the second connection structure 631, and the cathode electrode 63 of the OLED device surround the OLED device, so as to prevent water/oxygen from entering OLED device.

The encapsulation structure in EMBODIMENT THREE is formed by performing at least steps of:
 forming the pixel defining layer 50 from an organic material;
 forming the first connection structure 611, wherein the first connection structure 611 is connected to the interlayer insulation layer 83 via the through-hole in the planarization layer 40, the first connection structure 611 and the anode electrode 61 of the OLED device are made of a same material and are formed simultaneously, and the first connection structure 611 is electrically insulated from the anode electrode 61; and
 forming the cathode electrode 63 of the OLED device, such that the cathode electrode 63 of the OLED device includes a second connection structure 631, wherein the second connection structure 631 is connected to an upper surface of the first connection structure 611 via a through-hole in the pixel defining layer 50, and the second connection structure 631 is electrically insulated from the anode electrode 61.

Embodiment Four

Figure 5:
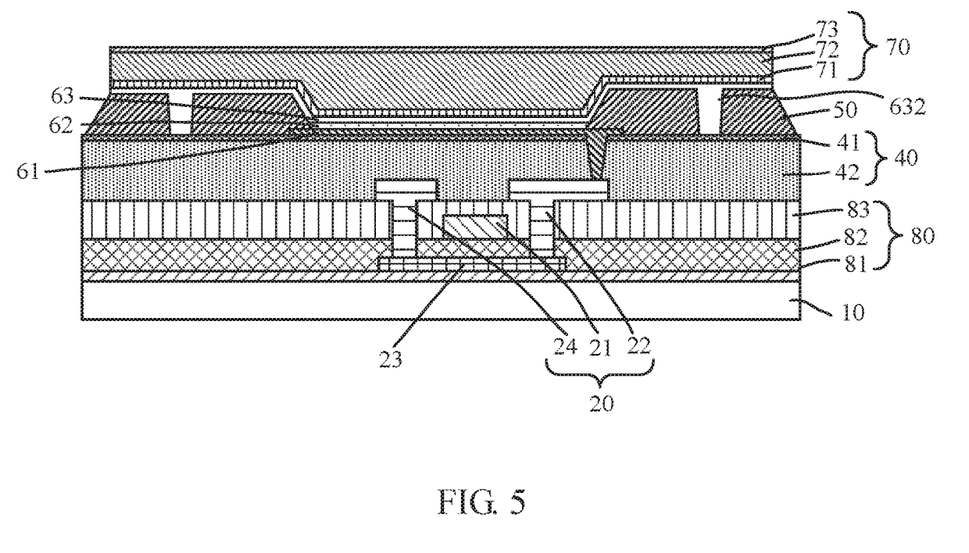
FIG. 5 is a schematic diagram showing a cross-sectional view of an OLED display manufactured according to EMBODIMENT FOUR of the present disclosure.

Please refer to FIG. 5. In this embodiment, the pixel defining layer 50 is made of an organic material. The planarization layer 40 is consisted of an organic sublayer 42 and an inorganic sublayer 41. The inorganic sublayer 41 of the planarization layer 40 is disposed on the organic sublayer 42 of the planarization layer 40. The cathode electrode 63 of the OLED device includes a third connection structure 632. The third connection structure 632 is connected to the inorganic sublayer 41 of the planarization layer 40 via the through-hole in the pixel defining layer 50. The third connection structure 632 is electrically insulated from the anode electrode 61.

Therefore, the inorganic insulation layer 80, the inorganic sublayer 41 of the planarization layer 40, and the inorganic sublayers 71 and 73 of the encapsulation layer 70 in the TFT array are all made of inorganic material. The inorganic material, the third connection structure 632, and the cathode electrode 63 of the OLED device surround the OLED device, so as to prevent water/oxygen from entering OLED device.

The encapsulation structure in EMBODIMENT FOUR is formed by performing at least steps of:
 forming the pixel defining layer 50 from an organic material;
 forming the planarization layer 40 includes forming an organic sublayer 42 and an inorganic sublayer 41, wherein the inorganic sublayer 41 of the planarization layer 40 is formed on the organic sublayer 42 of the planarization layer 40;
 forming the cathode electrode 63 of the OLED device, such that the cathode electrode 63 of the OLED device includes a third connection structure 632, wherein the third connection structure 632 is connected to the inorganic sublayer 41 of the planarization layer 40 via the through-hole in the pixel defining layer 50, and the third connection structure 632 is electrically insulated from the anode electrode 61.

Embodiment Five

Figure 6A:
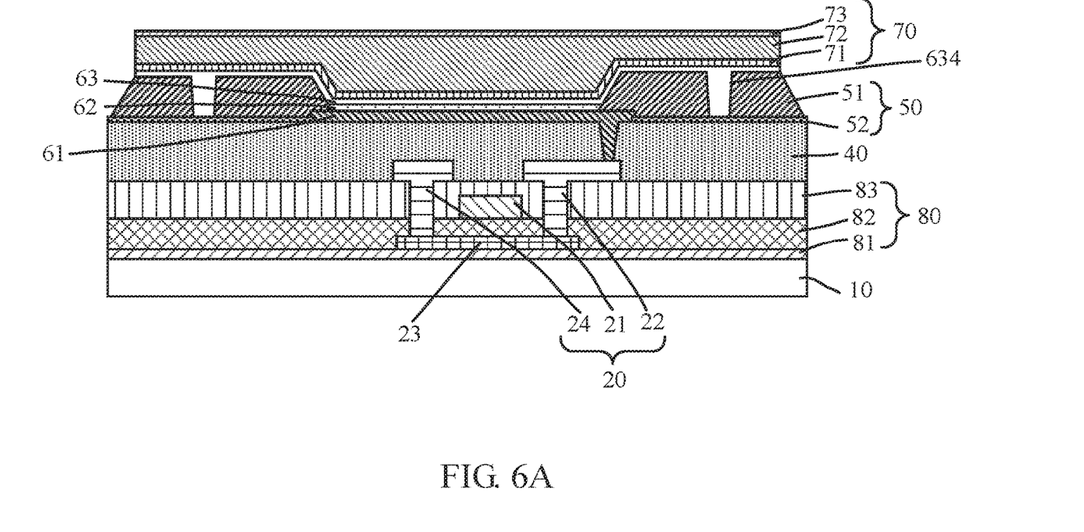
FIGS. 6A and 6B are schematic diagrams showing cross-sectional views of an OLED display manufactured according to EMBODIMENT FIVE of the present disclosure.
Figure 6B:
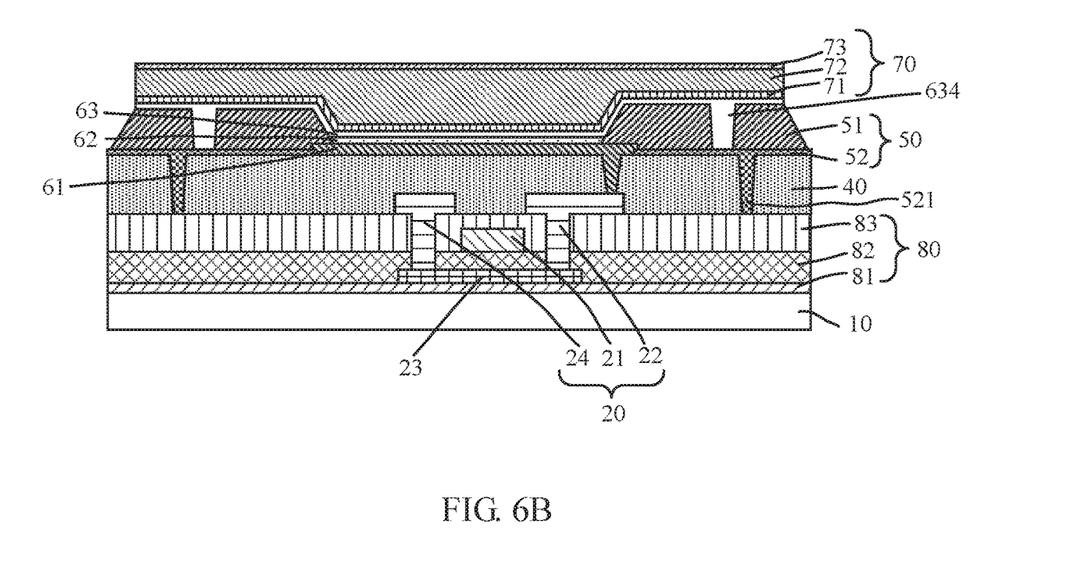

Please refer to FIGS. 6A and 6B. In this embodiment, the pixel defining layer 50 is consisted of an organic sublayer 51 and an inorganic sublayer 52. The organic sublayer 51 of the pixel defining layer 50 is disposed on the inorganic sublayer 52 of the pixel defining layer 50. The inorganic sublayer 52 of the pixel defining layer 50 does not include (as shown in FIG. 6A) or includes (as shown in FIG. 6B) a second plug 521. The second plug 521 is connected to the interlayer insulation layer 83 via the through-hole in the planarization layer 40. The anode electrode 61 of the OLED device is disposed on the planarization layer 40. The cathode electrode 63 of the OLED device includes a fourth connection structure 634. The fourth connection structure 634 is connected to the inorganic sublayer 52 of the pixel defining layer 50 via the through-hole in the pixel defining layer 50. The fourth connection structure 634 is electrically insulated from the anode electrode 61.

Therefore, the inorganic insulation layer 80, the second plug 521, the inorganic sublayer 52 of the pixel defining layer 50, and the inorganic sublayers 71 and 73 of the encapsulation layer 70 in the TFT array are all made of inorganic material. The inorganic material, the fourth connection structure 634, and the cathode electrode 63 of the OLED device surround the OLED device, so as to prevent water/oxygen from entering OLED device.

The encapsulation structure in EMBODIMENT FIVE is formed by performing at least steps of:
- forming the pixel defining layer 50 includes forming an organic sublayer 51 and an inorganic sublayer 52, wherein the organic sublayer 51 of the pixel defining layer 50 is formed on the inorganic sublayer 52 of the pixel defining layer 50;
- the inorganic sublayer 52 of the pixel defining layer 50 does not include or includes a second plug 521, and the second plug 521 is connected to the interlayer insulation layer 83 via the through-hole in the planarization layer 40;
- forming the anode electrode 61 of the OLED device, such that the anode electrode 61 of the OLED device is formed on the planarization layer 40; and
- forming the cathode electrode 63 of the OLED device, such that the cathode electrode 63 of the OLED device includes a fourth connection structure 634, wherein the fourth connection structure 634 is connected to the inorganic sublayer 52 of the pixel defining layer 50 via the through-hole in the pixel defining layer 50.

Compared to the prior art, the present disclosure provides an OLED display and a method for manufacturing same. According to the present disclosure, one or more inorganic material included in the inorganic insulation layer, the planarization layer, the pixel defining layer, and the encapsulation layer, the plug, and the connection structure surround each sub-pixel, each pixel, or more than one pixel of the OLED display, therefore water/oxygen is effectively prevented from entering OLED device.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. An organic light emitting diode (OLED) display, comprising:
   a substrate;
   a thin film transistor (TFT) device disposed on the substrate, wherein a gate electrode, a source electrode, and a drain electrode of the TFT device are isolated from each other by an inorganic insulation layer;
   a planarization layer disposed on the TFT device and the inorganic insulation layer;
   a pixel defining layer disposed on the planarization layer, wherein the pixel defining layer defines a plurality of pixels in the OLED display, and each pixel includes a plurality of sub-pixels;
   an OLED device disposed on the planarization layer and the pixel defining layer; and
   an encapsulation layer disposed on the OLED device;
   wherein one or more inorganic material included in the inorganic insulation layer, the planarization layer, and the encapsulation layer and a cathode electrode of the OLED device surround each sub-pixel, each pixel, or more than one pixel of the OLED display; and
   wherein the pixel defining layer is made of an inorganic material, and the pixel defining layer includes a first plug that is connected to the inorganic insulation layer via a through-hole in the planarization layer.

2. The OLED display according to claim 1, wherein the inorganic material is selected from silicon oxide, silicon nitride, silicon oxynitride, or aluminum oxide.

3. The OLED display according to claim 1,
   further comprising a first connection structure, the first connection structure is connected to the inorganic insulation layer via the through-hole in the planarization layer, and the first connection structure and an anode electrode of the BLED device are made of a same material.

4. The OLED display according to claim 1,
   wherein the inorganic insulation layer comprises:
      a buffer layer disposed on the substrate;
      a gate insulation layer disposed on the buffer layer; and
      an interlayer insulation layer disposed on the gate insulation layer; and
   wherein the encapsulation layer has a stack structure that includes a plurality of inorganic sublayers and a plurality of organic sublayers.

5. An organic light emitting diode (OLED) display, comprising:
   a substrate;
   a thin film transistor (TFT) device disposed on the substrate; wherein a gate electrode; a source electrode, and a drain electrode of the TFT device are isolated from each other by an inorganic insulation layer;
   a planarization layer disposed on the TFT device and the inorganic insulation layer;
   a pixel defining layer disposed on the planarization layer, wherein the pixel defining layer defines a plurality of pixels in the OLED display, and each pixel includes a plurality of sub-pixels;
   an OLED device disposed on the planarization layer and the pixel defining layer; and
   an encapsulation layer disposed on the OLED device;
   wherein one or more inorganic material included in the inorganic insulation layer, the planarization layer, and the encapsulation layer and a cathode electrode of the OLED device surround each sub-pixel, each pixel, or more than one pixel of the OLED display; and
   wherein the pixel defining layer is made of an organic material, and the OLED device further comprises a first connection structure connected to the inorganic insulation layer via the through-hole in the planarization layer, and the first connection structure and an anode electrode of the OLED device are made of a same material; the cathode electrode of the OLED device includes a second connection structure in the pixel defining layer that is connected to an upper surface of the first connection structure; or
   wherein the pixel defining layer is made of an organic material; the planarization layer consists of an organic sublayer and an inorganic sublayer, and the inorganic sublayer of the planarization layer is disposed on the organic sublayer of the planarization layer; the cathode electrode of the OLED device includes a third connection structure, and the third connection structure is connected to the inorganic sublayer of the planarization layer via the through-hole in the pixel defining layer; or
   wherein the pixel defining layer consists of an organic sublayer and an inorganic sublayer, and the organic sublayer of the pixel defining layer is disposed on the inorganic sublayer of the pixel defining layer; the anode electrode of the OLED device is disposed on the planarization layer; the cathode electrode of the OLED device includes a fourth connection structure, and the fourth connection structure is connected to the inorganic sublayer of the pixel defining layer via the through-hole in the pixel defining layer.

6. The OLED display according to claim 5, wherein the inorganic material is selected from silicon oxide, silicon nitride, silicon oxynitride, or aluminum oxide.

7. The OLED display according to claim 5,
wherein when the pixel defining layer consists of the organic sublayer and the inorganic sublayer, the inorganic sublayer of the pixel defining layer further includes a second plug, and the second plug is connected to the inorganic insulation layer via the through-hole in the planarization layer.

8. The OLED display according to claim 5, wherein the organic material is selected from acrylic organic compound, polyamide, or polyimide.

9. The OLED display according to claim 5,
wherein the inorganic insulation layer comprises:
a buffer layer disposed on the substrate;
a gate insulation layer disposed on the buffer layer; and
an interlayer insulation layer disposed on the gate insulation layer; and
wherein the encapsulation layer has a stack structure that includes a plurality of inorganic sublayers and a plurality of organic sublayers.

10. A method for manufacturing an organic light emitting diode (OLED) display, comprising steps of:
providing a substrate;
forming a thin film transistor (TFT) device on the substrate, wherein a gate electrode, a source electrode, and a drain electrode of the TFT device are isolated from each other by an inorganic insulation layer;
forming a planarization layer on the TFT device and the inorganic insulation layer;
forming a pixel defining layer on the planarization layer, wherein the pixel defining layer defines a plurality of pixels in the OLED display, and each pixel includes a plurality of sub-pixels;
forming an OLED device on the planarization layer and the pixel defining layer;
forming an encapsulation layer on the OLED device; and
forming the pixel defining layer from an inorganic material, wherein the pixel defining layer includes a first plug that is connected to the inorganic insulation layer via a through-hole in the planarization layer; or
forming the pixel defining layer from an organic material; forming a first connection structure, wherein the first connection structure is connected to the inorganic insulation layer via the through-hole in the planarization layer, and the first connection structure and an anode electrode of the OLED device are made of a same material and are formed simultaneously; and forming a cathode electrode of the OLED device, such that the cathode electrode of the OLED device includes a second connection structure in the pixel defining layer that is connected to an upper surface of the first connection structure; or
forming the pixel defining layer from an organic material; wherein forming the planarization layer includes forming an organic sublayer and an inorganic sublayer, wherein the inorganic sublayer of the planarization layer is formed on the organic sublayer of the planarization layer; forming the cathode electrode of the OLED device, such that the cathode electrode of the OLED device includes a third connection structure, wherein the third connection structure is connected to the inorganic sublayer of the planarization layer via the through-hole in the pixel defining layer; or
forming the pixel defining layer includes forming an organic sublayer and an inorganic sublayer, wherein the organic sublayer of the pixel defining layer is formed on the inorganic sublayer of the pixel defining layer; the inorganic sublayer of the pixel defining layer does not include or includes a second plug, and the second plug is connected to the inorganic insulation layer via the through-hole in the planarization layer; forming the anode electrode of the OLED device, such that the anode electrode of the OLED device is formed on the planarization layer; and forming the cathode electrode of the OLED device, such that the cathode electrode of the OLED device includes a fourth connection structure, wherein the fourth connection structure is connected to the inorganic sublayer of the pixel defining layer via the through-hole in the pixel defining layer;
wherein one or more inorganic material included in the inorganic insulation layer, the planarization layer, and the encapsulation layer and a cathode electrode of the OLED device surround each sub-pixel, each pixel, or more than one pixel of the OLED display.

11. The method for manufacturing the OLED display according to claim 10, wherein the inorganic material is selected from silicon oxide, silicon nitride, silicon oxynitride, or aluminum oxide.

12. The method for manufacturing the OLED display according to claim 10, wherein the step of forming the pixel defining layer from the inorganic material further comprises steps of:
forming a first connection structure, wherein the first connection structure is connected to the inorganic insulation layer via the through-hole in the planarization layer; and the first connection structure and an anode electrode of the OLED device are made of a same material and are formed simultaneously, or
wherein in the step of forming the pixel defining layer includes forming the organic sublayer and the inorganic sublayer.

13. The method for manufacturing the OLED display, according to claim 11, wherein the organic material is selected from acrylic organic compound, polyamide, or polyimide.

14. The method for manufacturing the OLED display according to claim 10,
wherein the inorganic insulation layer comprises:
a buffer layer formed on the substrate;
a gate insulation layer formed on the buffer layer; and
an interlayer insulation layer formed on the gate insulation layer; and
forming the encapsulation layer includes forming a stack structure that includes a plurality of inorganic sublayers and a plurality of organic sublayers.

* * * * *